(12) United States Patent
Mai (10) Patent No.: US 10,685,813 B2
(45) Date of Patent: Jun. 16, 2020

(54) PLASMA TREATMENT DEVICE WITH TWO MICROWAVE PLASMA SOURCES COUPLED TO ONE ANOTHER, AND METHOD FOR OPERATING A PLASMA TREATMENT DEVICE OF THIS KIND

(71) Applicant: Meyer Burger (Germany) GmbH, Hohenstein-Ernstthal (DE)

(72) Inventor: Joachim Mai, Nobitz (DE)

(73) Assignee: Meyer Burger (Germany) GmbH, Hohenstein-Ernstthal (DE)

( * ) Notice: Subject to any disclaimer, the term of this patent is extended or adjusted under 35 U.S.C. 154(b) by 0 days.

(21) Appl. No.: 16/341,455

(22) PCT Filed: Oct. 10, 2017

(86) PCT No.: PCT/EP2017/075777
§ 371 (c)(1),
(2) Date: Apr. 12, 2019

(87) PCT Pub. No.: WO2018/069299
PCT Pub. Date: Apr. 19, 2018

(65) Prior Publication Data
US 2019/0252156 A1    Aug. 15, 2019

(30) Foreign Application Priority Data

Oct. 12, 2016  (EP) .................................. 16193511

(51) Int. Cl.
*H01J 37/32*  (2006.01)
*H05H 1/46*   (2006.01)

(52) U.S. Cl.
CPC .. *H01J 37/32229* (2013.01); *H01J 37/32192* (2013.01); *H01J 37/32568* (2013.01); *H05H 2001/4607* (2013.01)

(58) Field of Classification Search
None
See application file for complete search history.

(56) References Cited

U.S. PATENT DOCUMENTS

| 4,316,791 A | * | 2/1982 | Taillet | ............... H01J 37/32082 |
| | | | | 156/345.28 |
| 4,987,346 A | * | 1/1991 | Katzschner | ............. H01J 37/08 |
| | | | | 315/111.41 |
| 5,911,833 A | * | 6/1999 | Denison | ................ B08B 7/0035 |
| | | | | 134/1.1 |

(Continued)

FOREIGN PATENT DOCUMENTS

| DE | 10341239 A1 | 4/2005 |
| JP | H03191068 A | 8/1991 |

(Continued)

*Primary Examiner* — Alexander H Taningco
*Assistant Examiner* — Srinivas Sathiraju
(74) *Attorney, Agent, or Firm* — Michael Soderman (57) ABSTRACT

The invention relates to a plasma treatment device with a treatment chamber, at least one pair of microwave plasma sources and at least one voltage source. Each pair of microwave plasma sources consists of a first microwave plasma source and a second microwave plasma source, wherein the first and the second microwave plasma source each have a plasma source wall and, within this, a microwave coupling-in device and a plasma electrode. The first and the second microwave plasma source are arranged within the treatment chamber on the same side of one or more substrates to be processed and adjacently to one another. The plasma electrodes of the first microwave plasma source and the second microwave plasma source are electrically insulated from one another and electrically conductively connected to the at least one voltage source. Here, the at least one voltage source is suitable for supplying the plasma electrodes of the first and the second microwave plasma source with different potentials. The invention also relates to a method for operating a plasma treatment device of this kind.

17 Claims, 5 Drawing Sheets

(56) References Cited

U.S. PATENT DOCUMENTS

| | | | | | |
|---|---|---|---|---|---|
| 6,045,618 | A * | 4/2000 | Raoux | ............... | B01D 45/06 |
| | | | | | 118/715 |
| 6,172,322 | B1 * | 1/2001 | Shang | ............... | C23C 16/56 |
| | | | | | 219/121.43 |
| 6,922,019 | B2 * | 7/2005 | Leung | ............... | H01J 27/18 |
| | | | | | 250/492.3 |
| 8,198,123 | B2 * | 6/2012 | Britt | ............... | C23C 14/024 |
| | | | | | 438/95 |
| 8,202,393 | B2 * | 6/2012 | Wong | ............... | C23C 16/4412 |
| | | | | | 118/715 |
| 8,518,162 | B2 * | 8/2013 | Smith | ............... | H01J 37/32192 |
| | | | | | 422/173 |
| 8,643,280 | B2 * | 2/2014 | Heil | ............... | H01J 37/32009 |
| | | | | | 216/67 |
| 8,900,402 | B2 * | 12/2014 | Holland | ............... | H01J 37/32899 |
| | | | | | 156/345.29 |
| 9,984,857 | B2 * | 5/2018 | Mai | ............... | H01J 37/32091 |
| 10,438,773 | B1 * | 10/2019 | Kobernik | ............... | H01J 37/32082 |
| 2006/0254521 | A1 * | 11/2006 | Mai | ............... | H01J 37/32192 |
| | | | | | 118/723 MA |
| 2009/0242131 | A1 * | 10/2009 | Mai | ............... | H01J 37/32192 |
| | | | | | 156/345.42 |
| 2010/0006227 | A1 * | 1/2010 | Radoui | ............... | H01J 37/32192 |
| | | | | | 156/345.41 |
| 2010/0184299 | A1 * | 7/2010 | Takahashi | ............... | H01L 21/31138 |
| | | | | | 438/710 |
| 2011/0005454 | A1 * | 1/2011 | Schreck | ............... | C23C 16/27 |
| | | | | | 117/103 |
| 2011/0073282 | A1 * | 3/2011 | Guelles | ............... | H05H 1/46 |
| | | | | | 165/104.11 |
| 2011/0197759 | A1 * | 8/2011 | Smith | ............... | H01J 37/32192 |
| | | | | | 95/4 |
| 2011/0300717 | A1 * | 12/2011 | Kikuchi | ............... | H01L 21/0212 |
| | | | | | 438/761 |
| 2013/0243966 | A1 * | 9/2013 | Schett | ............... | C23C 14/48 |
| | | | | | 427/523 |
| 2015/0091442 | A1 * | 4/2015 | Mai | ............... | H01J 37/3222 |
| | | | | | 315/111.41 |
| 2016/0290223 | A1 * | 10/2016 | Mills | ............... | C10L 5/40 |
| 2018/0294135 | A1 * | 10/2018 | Mai | ............... | H01J 27/024 |
| 2019/0252156 | A1 * | 8/2019 | Mai | ............... | H01J 37/32192 |

FOREIGN PATENT DOCUMENTS

| | | |
|---|---|---|
| WO | 0139560 A1 | 5/2001 |
| WO | 2012154666 A1 | 11/2012 |

* cited by examiner

PLASMA TREATMENT DEVICE WITH TWO MICROWAVE PLASMA SOURCES COUPLED TO ONE ANOTHER, AND METHOD FOR OPERATING A PLASMA TREATMENT DEVICE OF THIS KIND

CROSS REFERENCE TO RELATED APPLICATIONS

This application is the U.S. national stage of International Application No. PCT/EP2017/075777, filed on 2017 Oct. 10. The international application claims the priority of EP 16193511.9 filed on 2016 Oct. 12; all applications are incorporated by reference herein in their entirety.

BACKGROUND

The invention relates to a plasma treatment device which contains two microwave plasma sources coupled to one another, and to a method for operating a plasma treatment device of this kind. In particular the plasma treatment device is a continuous feed system, through which a substrate to be treated is passed by means of a transport device during the plasma treatment.

Plasma treatment devices are used for the processing of substrate surfaces, in particular for the deposition or removal of layers on or from the substrate surface and for the modification of the properties of the substrate surface. Here, the particles (molecules, atoms or electrically charged particles) necessary for the processing are excited or produced with the aid of a plasma. For large substrates, continuous feed systems or inline systems are often used, in which a plurality of plasma sources can also be arranged in succession in the transport direction of the substrates, as appropriate.

For the generation and maintenance of the plasma, there are various possibilities for introducing the energy necessary for this purpose into a gas or gas mixture. One possibility is excitation by means of microwaves (frequency in the range of 900 MHz to 10 GHz), whereby high plasma densities can be achieved in the generated plasma, and therefore high deposition rates or high etching rates based on a chemical reaction. Microwave plasma sources are described by way of example in DE 198 12 558 A1 and DE 103 41 239 A1. The plasmas excited using microwaves of this kind form plasma boundary layers with low boundary layer potentials as the plasmas interact with walls or substrate surfaces. The charge carriers (ions and electrons) contacting the substrate surface thus only have a low energy, usually less than 10 eV. However, for improved control of the processing, for example for the control of layer properties, such as density, strength or stress of a deposited layer, greater and/or controllable energies especially for the ion currents to the substrate surface are desirable.

For this purpose, the microwave plasma can be superimposed by an electric field, one electrode of which is provided by the substrate to be processed or a substrate carrier, on which the substrate is supported during the processing. To this end, a defined reference potential is applied to the substrate or the substrate carrier, which potential causes an acceleration of the electrically charged particles contacting the substrate surface, in particular ions, from the plasma to the substrate surface in the electric field. In stationary systems, the substrate carrier can usually be directly contacted. For continuous feed systems, a capacitive coupling of the substrate carrier to a defined potential, for example ground, is known, for example from DE 10 2012 103 425 A1.

However, this purely capacitive coupling of the substrate carrier to a defined potential and therefore the generation of a defined electric field is unstable and can be controlled only inadequately. In addition, parasitic plasmas may form, and these are undesirable.

SUMMARY

The invention relates to a plasma treatment device with a treatment chamber, at least one pair of microwave plasma sources and at least one voltage source. Each pair of microwave plasma sources consists of a first microwave plasma source and a second microwave plasma source, wherein the first and the second microwave plasma source each have a plasma source wall and, within this, a microwave coupling-in device and a plasma electrode. The first and the second microwave plasma source are arranged within the treatment chamber on the same side of one or more substrates to be processed and adjacently to one another. The plasma electrodes of the first microwave plasma source and the second microwave plasma source are electrically insulated from one another and electrically conductively connected to the at least one voltage source. Here, the at least one voltage source is suitable for supplying the plasma electrodes of the first and the second microwave plasma source with different potentials. The invention also relates to a method for operating a plasma treatment device of this kind.

DETAILED DESCRIPTION

One object of the present application is therefore to provide a plasma treatment device which offers another possibility for superimposing an electric field and a microwave plasma and which overcomes the disadvantages of the prior art. A further object of the present application is to provide a method for operating a plasma treatment device of this kind.

These objects are achieved by the plasma treatment device according to claim 1 and the method according to claim 12. Advantageous developments and embodiments can be found in the dependent claims.

The plasma treatment device according to the invention contains a treatment chamber, at least a pair of microwave plasma sources, and at least one voltage source. The treatment chamber is a chamber in which the ambient conditions necessary for the plasma treatment of one or more substrates, for example pressure or temperature, can be set. The substrates to be treated are arranged in the treatment chamber during the operation of the plasma treatment device, wherein, during the plasma treatment, these substrates can be arranged within the treatment chamber in a stationary manner or can be transported through the treatment chamber.

At least one pair of microwave plasma sources is arranged within the treatment chamber. Each pair of microwave plasma sources consists of a first microwave plasma source and a second microwave plasma source. The first and the second microwave plasma source each have a plasma source wall and, within this, a microwave coupling-in device and a plasma electrode. The plasma source wall forms a gas-tight delimitation of the microwave plasma source in a first region and has a plasma discharge opening in a second region, through which opening particles, during the operation of the plasma treatment device, leave the plasma in the direction of the surface to be processed of the one or more substrates. The second region is preferably arranged facing the surface to be processed of the one or more substrates. The first and the second microwave plasma source are arranged here on the same side of one or more substrates to be processed and are arranged adjacently to one another. The term "on the same side of a substrate" means that the microwave plasma sources process the same surface of a substrate and not opposite surfaces of a substrate. The term "adjacently to one another" means that no other plasma source is arranged between the first and the second microwave plasma source. The distance between the first and the second microwave plasma source, based on the sides of the plasma source wall facing one another, is configured here such that the technological requirements for substrate processing are met. Such requirements, for example, are the uniformity and intensity of the plasma processing. At the same time, however, the distance should be such that a plasma ignition in the intermediate region between the sides of the plasma source walls, facing one another, of the two microwave plasma sources is avoided or the risk thereof is at least reduced. Here, the minimum distance and the maximum distance between the two sides, facing one another, of the plasma source walls and also the progression of the distance along a direction perpendicular to the substrate surface to be processed are of significance for the avoidance of a plasma ignition of this kind. In addition, a plasma ignition depends on the pressure in the microwave plasma sources and the treatment chamber and on the voltage applied between the plasma electrodes of the microwave plasma sources. The distance between the first and the second microwave plasma source or between the sides, facing one another, of the plasma source walls of the two microwave plasma sources is measured here in a plane that runs substantially parallel to the substrate surface to be processed. The first and the second microwave plasma source are preferably directly adjacent to one another. However, the plasma electrodes of the first microwave plasma source and the second microwave plasma source are in any case electrically insulated from one another. The microwave coupling-in devices and also the plasma source walls can be designed here relatively freely. Microwave plasma sources that enable plasma generation with circular symmetry or that enable linearly scalable plasma generation can thus also be considered.

The at least one voltage source is electrically conductively connected to the plasma electrodes of the first and the second microwave plasma source and is suitable for applying different potentials to them. When potentials are applied and plasmas are ignited, the potential of the plasma electrode of the first microwave plasma source is thus used as a reference point for the potential of the plasma electrode of the second microwave plasma source. In other words: an electric field forms between the two plasma electrodes and causes the acceleration of electrically charged particles, for example ions, out of at least one plasma. The energy of the electrically charged particles contacting the surface of the substrates to be treated is thus increased, without having to apply a defined reference potential for the plasma of each microwave plasma source to the substrate or without having to couple the substrate capacitively to a reference potential of this kind. In particular, with this arrangement, the energy of the electrically charged particles contacting the surface of the substrates to be treated can also be controlled effectively and easily by controlling the potentials applied to the plasma electrodes.

The plasma treatment device preferably comprises a voltage source, which comprises a first output and a second output and is suitable for generating a potential difference between the first output and the second output. Here, the potential generated at the first output and the potential generated at the second output depend on one another and are linked to one another. The first output of the voltage source is connected to the plasma electrode of the first microwave plasma source, whereas the second output of the voltage source is connected to the plasma electrode of the second microwave plasma source.

This voltage source is particularly preferably a symmetrical voltage source.

However, the plasma treatment device can also comprise two voltage sources, wherein a first one is connected to the plasma electrode of the first microwave plasma source and a second one is connected to the plasma electrode of the second microwave plasma source, so that the plasma electrodes can each be supplied with potentials that can be controlled completely independently of one another. However, the two voltage sources can be provided in a single component, i.e. in one generator.

The at least one voltage source is a direct voltage source, a pulsed direct voltage source, or an alternating voltage source, wherein a direct voltage source or a pulsed direct voltage source, however, are used primarily in the case of two separate voltage sources for the plasma electrodes of the two microwave plasma sources. The frequencies of the provided pulsed direct voltages or the alternating voltages lie in the range of a few Hz to several hundred MHz.

The plasma treatment device according to the invention can also contain more than one pair of microwave plasma sources. This means that two, three or more pairs of microwave plasma sources can be arranged in the treatment chamber, wherein the plasma electrodes of all first microwave plasma sources can be supplied with the same potential and the plasma electrodes of all second microwave plasma sources can be supplied with another common potential. To this end, a common voltage source for all plasma electrodes or a common voltage source for the plasma electrodes of all first microwave plasma sources and another common voltage source for the plasma electrodes of all second microwave plasma sources can be used. Here, it is possible to arrange first and second microwave plasma sources alternately or to position a first microwave plasma source of a first pair of microwave plasma sources next to a first microwave plasma source of another pair of microwave plasma sources. Furthermore, different voltage sources can also be used and/or different potentials can be applied to the plasma electrodes of the first and second microwave plasma sources. Combinations of different described variants are possible.

In a preferred embodiment at least one of the first or second microwave plasma source has, within the plasma source wall, a plasma screen insulated with respect to ground, which plasma screen at least partially surrounds a plasma space of the microwave plasma source and is used as a plasma electrode. The plasma space is the region of the microwave plasma source in which the plasma is formed. The plasma screen is electrically insulated from the plasma source wall, which for example can be grounded, and has at least one gas passage, through which gas can flow into the plasma space. This plasma screen is preferably formed as a gas-permeable, electrically conductive perforated plate or grid. In addition, the plasma screen has at least one opening in a region facing the substrate to be processed, through which opening particles can leave the plasma and travel towards the surface of the substrate to be processed.

In another preferred embodiment the plasma source wall of at least one of the first or second microwave plasma source is insulated with respect to ground and is used as a plasma electrode. Here, the microwave plasma source can have a plasma screen which is electrically conductively connected to the plasma source wall or can be formed without a plasma screen of this kind.

In both embodiments all supply lines and mechanical holders which are arranged in the plasma space or lead thereto are electrically insulated with respect to ground in order to ensure the formation of a defined voltage over the plasma by means of the potential applied to the plasma electrode.

In a further preferred embodiment the sides, facing one another, of the plasma source wall of the first and second microwave plasma sources have a greater distance from the surface of the one or more substrates to be processed than the other sides of the plasma source walls.

In a preferred arrangement at least one of the two microwave plasma sources is arranged at an incline relative to the other microwave plasma source or relative to the surface of the substrates to be processed. Both microwave plasma sources are particularly preferably similarly inclined relative to one another. The term "inclined arrangement of the microwave plasma sources" is understood to mean an arrangement with which the angle between the plane of the plasma discharge opening of the microwave plasma source and the substrate surface to be processed is greater than 0 (zero) and less than or equal to 90°, wherein the plasma discharge opening of the inclined microwave plasma source points in the direction of the other microwave plasma source of the pair of microwave plasma sources. For the plasma source walls facing one another, this results in an increased distance from the substrate plane than in the outwardly directed regions. Depending on the inclination and distance of the microwave plasma sources, larger or smaller regions of overlap of the individual microwave plasmas generated with the microwave plasma sources are thus produced. If a microwave plasma source is not inclined, the plane of the plasma discharge opening of the microwave plasma source is parallel to the substrate surface to be processed.

The microwave plasma sources advantageously have magnets or magnet arrangements, which influence the extraction of the charge carriers from the microwave plasmas. Here, the mutually opposed magnets of the first and second microwave plasma sources are arranged either with identical polarity or opposite polarity so as to obtain a desired extraction of the charge carriers. "Mutually opposed magnets" means here those magnets which are arranged on sides, facing one another, of the plasma source walls of the two microwave plasma sources.

In addition, in a particularly preferred embodiment a gas inlet is arranged between the sides, facing one another, of the plasma source wall of the first and second microwave plasma sources. This gas inlet is suitable for admitting a gas into a connection region between the first and the second microwave plasma source, which connection region is adjacent to the surface of the substrate or plurality of substrates to be processed. A connection region between the plasma spaces of the two microwave plasma sources can thus be created during the operation of the microwave plasma sources, which connection region has an increased electrical conductivity compared to the other regions of the treatment chamber and enables or improves an electrically conductive connection between the two plasma spaces.

In another preferred embodiment the plasma treatment device has a common microwave power splitter for the first and second microwave plasma source. New, compact plasma treatment devices can thus be constructed, and the two generated microwave plasmas can be better adapted to one another, and components and therefore costs can be saved.

The plasma treatment device according to the invention is particularly suitable for the treatment of substrates which are moved through the treatment chamber during the processing, and is therefore suitable as a continuous feed system. For this purpose, the plasma treatment device preferably also contains a transport device suitable for transporting at least one substrate carrier, on which the substrate or a plurality of substrates to be processed is arranged, through the treatment chamber during the operation of the first and second microwave plasma sources.

The substrate carrier preferably consists here of an electrically conductive material. The substrate carrier is thus incorporated in the electric circuit between the two plasma electrodes and forms a voltage splitter.

However, substrate carriers that are hardly electrically conductive or that are not electrically conductive can also be used. In this case, the distance between the sides, facing one another, of the plasma source wall of the first and second microwave plasma sources should be as small as possible, and the distance of the sides, facing one another, of the plasma source wall of the first and second microwave plasma sources from the surface of the substrates to be processed should be greater than that of the other sides of the plasma source walls, as has already been explained with reference to a preferred embodiment of the plasma treatment device. This embodiment of the plasma treatment chamber makes it possible to form a connection region between the plasma spaces of the two microwave plasma sources during the operation of the microwave plasma sources, which connection region enables or improves an electrically conductive connection between the two plasma spaces.

The method according to the invention for operating the plasma treatment device according to the invention includes the ignition of a plasma in each of the first and second microwave plasma sources with the aid of a microwave power and also includes the application of different potentials to the plasma electrodes of the first microwave plasma source and of the second microwave plasma source during the maintenance of the plasmas. The potentials are fed to the plasma electrodes with the aid of the at least one voltage source, wherein each of these potentials is used as a reference potential for the plasma electrode of the other microwave plasma source.

A voltage thus drops between the plasma electrodes of the first and the second microwave plasma source, which voltage is determined by the potentials fed to the plasma electrodes from the at least one voltage source. This voltage is a direct voltage, a pulsed direct voltage, or an alternating voltage according to the embodiment of the at least one voltage source.

The substrate or a plurality of substrates to be processed is preferably transported through the plasma treatment device during the operation of the first and second microwave plasma sources. Here, the substrate or substrates is/are arranged on at least one substrate carrier, as has already been described with reference to the plasma treatment device.

In a further preferred embodiment the microwave coupling-in devices of the first and the second microwave plasma source are operated with in-phase pulsed microwave powers or with phase-shifted pulsed microwave powers. In addition, the microwave power of each microwave plasma source is preferably pulsed also in a manner synchronised with the voltage between the plasma electrodes provided by the at least one voltage source.

BRIEF DESCRIPTION OF THE DRAWINGS

The invention will be explained hereinafter on the basis of exemplary embodiments and drawings.

In the drawings.

DETAILED DESCRIPTION OF THE PREFERRED EMBODIMENTS

Figure 1:
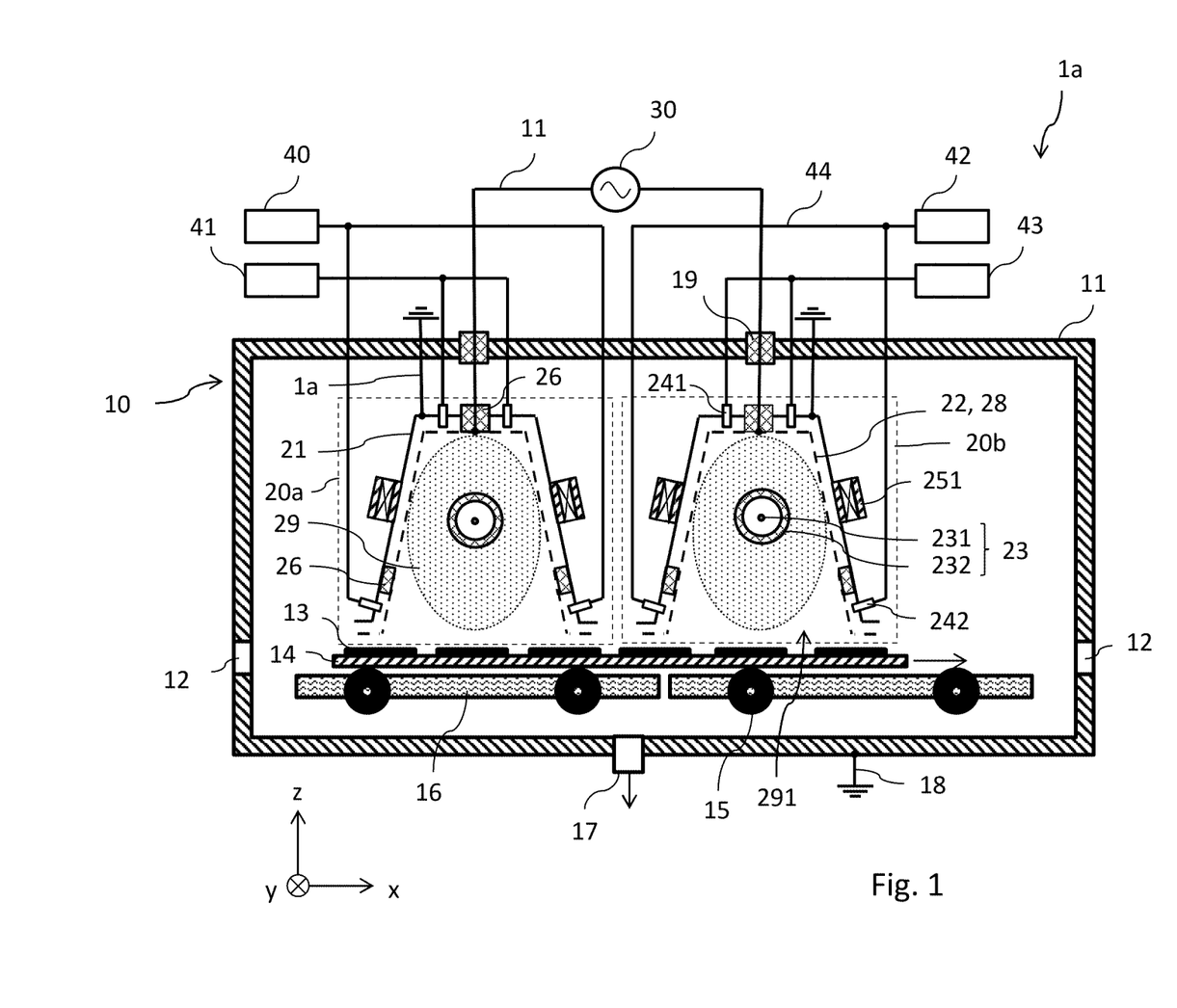
FIG. 1 shows a first embodiment (1a) of the plasma treatment device according to the invention, in which a plasma screen (22) of each of the microwave plasma sources (20a, 20b) is used as a plasma electrode (28) in each case.

FIG. 1 shows a first embodiment (1a) of the plasma treatment device according to the invention in a cross-section through a treatment chamber (10), wherein components of the plasma treatment device which are arranged outside the treatment chamber (10) are illustrated merely schematically. These are, in particular, a voltage source (30) with the associated electrical feed lines (31) and gas supplies (40 to 43) with the associated gas feed lines (44).

The treatment chamber (10) has a chamber wall (11), in which there is/are formed one or more opening gaps (12). The opening gaps (12) are used to introduce and discharge one or more substrates (13) to be treated in the treatment chamber or one or more substrate carriers (14), on which the substrates (13) to be treated are arranged. Here, the substrates (13) can be positioned in a stationary manner or moved in the treatment chamber (10) during the plasma treatment. In particular, the plasma treatment device (1a) can be a continuous feed system, as is illustrated in FIG. 1, in which the substrates (13), during the treatment, are moved continuously through the treatment chamber (10) by means of a transport device (15) along a first direction (here the x-direction) from a first opening gap (12) to a second opening gap (12) disposed on the opposite chamber wall (11). This is indicated by the arrow with reference to the substrate carrier (14). Heaters (16) or cooling devices can be arranged in the treatment chamber (10) and ensure a defined temperature of the substrates (13) during the treatment. The treatment chamber (10) also usually has a pump connection point (17), which is connected to a suction pump and enables gas to be pumped out from the treatment chamber (10). In addition, insulated electrical bushings (or feedthroughs) (19) are formed in the chamber wall (11), which is provided with a grounding (18).

At least one pair of microwave plasma sources (20a, 20b) is arranged in the treatment chamber, wherein each pair consists of a first microwave plasma source (20a) and a second microwave plasma source (20b). The first microwave plasma source (20a) and the second microwave plasma source (20b) are formed identically in the illustrated drawings, although this is not absolutely necessary. For reasons of clarity of the illustration, like components in both microwave plasma sources (20a, 20b) are provided with a reference sign in relation to just one of the microwave plasma sources (20a or 20b). In the first embodiment (1a) of the plasma treatment device, each microwave plasma source (20a, 20b) contains a plasma source wall (21), a plasma screen (22), a microwave coupling-in device (23), gas inlets (241, 242), and magnets (251).

The plasma source wall (21) forms a closed physical encasement of a plasma space (29) with the exception of a plasma discharge opening (291), through which particles can leave the plasma space (29) in the direction of a surface to be treated of the substrates (13).

The gas inlets (241, 242) can be arranged for example on the upper side of the plasma source wall (21), which is the side of the plasma source wall (21) facing away from the substrates (13) to be treated, and can be arranged close to the substrates (13) in lateral regions of the plasma source wall (21), and will be referred to hereinafter as upper gas inlets (241) and lateral gas inlets (242). The gas inlets are connected to gas supplies (40 to 43) in each case via gas feed lines (44). In the illustrated case, the lateral gas inlets (242) of the first microwave plasma source (20a) are connected to a first gas supply (40), the upper gas inlets (241) of the first microwave plasma source (20b) are connected to a second gas supply (41), the lateral gas inlets (242) of the second microwave plasma source (20b) are connected to a third gas supply (42), and the upper gas inlets (241) of the second microwave plasma source (20b) are connected to a fourth gas supply (43). The first and the third gas supply (40, 42) preferably provide different gases compared to the second and fourth gas supply (41, 43). This is advantageous in particular if the gas fed via the lateral gas inlets (242) is not to be influenced as heavily by a plasma generated in the microwave plasma source (20a, 20b) compared to the gases fed via the upper gas inlets (241). For effective gas utilisation, gases having a particularly high reactivity should be provided closer to the substrate surface than gases having a low reactivity. In addition, all gas supplies (40 to 43) can also provide different gases, as is indicated in FIG. 1.

The plasma screen (22) is electrically separated from the plasma source wall (21) by the electrical insulation (26). The plasma source wall (21) can therefore be grounded by means of an electrical connection (27) to ground, whereas the plasma screen (22) is electrically conductively connected to the voltage source (30) and is used as a plasma electrode (28). During the operation of the microwave plasma sources (20a, 20b) a plasma is ignited by the supply of energy by means of microwaves via the microwave coupling-in device (23), which plasma fills the plasma space (29) of the microwave plasma source (20a, 20b). The physical extent and position of the plasma space (29) is determined by the design of the microwave plasma source (20a, 20b), the fed microwave energy, and the design and arrangement of the magnets (251). Here, the plasma space (29) can reach as far as the surface of the substrates (13), however the lower boundary of the plasma space (29) can also be distanced from the surface of the substrates (13) along the z-direction. The microwave coupling-in device (23) contains an inner conductor (231), which is connected to a microwave supply, which is not illustrated in FIG. 1, and an insulation tube (232), which electrically insulates the inner conductor (231) from the surrounding environment.

The first and the second microwave plasma sources (20a, 20b), as illustrated in FIG. 1, can be arranged adjacently in the feedthrough direction of the substrates (x-direction) or also adjacently transversely to the feedthrough direction of the substrates, i.e. in the y-direction.

In accordance with the invention the plasma electrodes (28) of the first and second microwave plasma sources (20a, 20b) are electrically conductively connected to at least one voltage source (30) so that different potentials are applied to them during operation of the microwave plasma sources (20a, 20b). In the first exemplary embodiment the plasma treatment device (1a) has just one voltage source (30), wherein the plasma electrode (28) of the first microwave plasma source (20a) is connected to a first output of the voltage source (30) and the plasma electrode (28) of the second microwave plasma source (20b) is connected to a second output of the voltage source (30). Here, the potentials generated at the first and at the second output of the voltage source (30) can be symmetrical with respect to ground, in other words the first potential and the second potential are of equal absolute value, but have different signs. If the first and the second microwave plasma source (20a, 20b) are constructed identically and are operated with the same parameters (microwave power, gas flow and gas composition), identical voltages thus drop across the plasmas of the two microwave plasma sources (20a, 20b) and are in each case half of the voltage provided by the voltage source (30). Of course, the potentials at the two outputs of the voltage source (30) can also be asymmetrical with respect to ground, so that the voltage dropping across the plasmas of the two microwave plasma sources corresponds in each case to only approximately half of the voltage provided by the voltage source (30). With the presence of just one voltage source (30), however, the potentials at the plasma electrodes (28) of the first and second microwave plasma sources (20a, 20b) depend on one another and are linked to one another.

The substrate carrier (14) preferably consists of a material that is a good electrical conductor, such as graphite, aluminium or a composite material (for example CFC), and thus conducts the current between the region of the substrate carrier (14) below the plasma space (29) of the first microwave plasma source (20a) and the region of the substrate carrier (14) below the plasma space (29) of the second microwave plasma source (20b) without a significant voltage drop. The first and the second microwave plasma source (20a, 20b) can thus be arranged independently of one another, in particular also with a large distance from one another along the x-direction. In order to continuously ensure the flow of current in the continuous feed operation, successive substrate carriers (14) should be connected to one another by an electrically conductive element, so that the distance between successive substrate carriers (14) is bridged. These elements can be, for example, elements protruding from an end of a substrate carrier (14), which elements rest on another substrate carrier (14) disposed before or after the substrate carrier (14) in question and produce the electrical contact.

Figure 2:
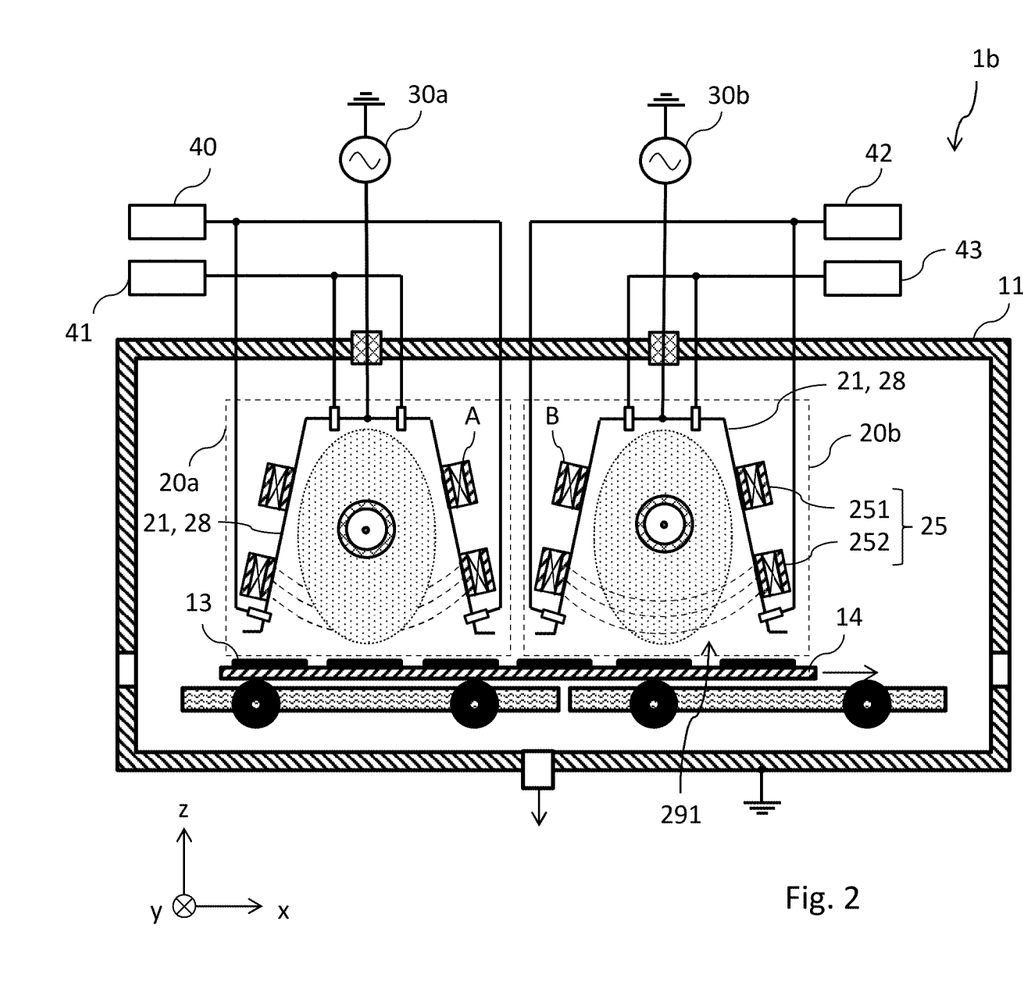
FIG. 2 shows a second embodiment (1b) of the plasma treatment device according to the invention, in which a plasma source wall (21) of each of the microwave plasma sources (20a, 20b) is used as a plasma electrode (28) in each case.

FIG. 2 shows a second embodiment (1b) of the plasma treatment device according to the invention, which differs from the first embodiment (1a) in that none of the microwave plasma sources (20a, 20b) contains a plasma screen, and instead the plasma source wall (21) is used in each case is a plasma electrode (28). In this case, the total microwave plasma source (20a, 20b) is in each case insulated with respect to ground.

In addition, it is illustrated in FIG. 2 that two different voltage sources (30a, 30b), in each case in relation to ground, can be used to provide the potentials to the plasma electrodes (28). Here, a first voltage source (30a) applies a first potential to the plasma electrode (28) of the first microwave plasma source (20a) and the second voltage source (30b) applies a second potential to the plasma electrode (28) of the second microwave plasma source (20b), wherein the second potential can be set completely independently of the first potential. The first and the second voltage source (30a, 30b) can also be provided here in one generator, provided it is ensured that the provided potentials are independent of one another. With corresponding fed potentials, different voltages can thus drop across the plasmas of the two microwave plasma sources (20a, 20b). This is particularly expedient if the microwave plasma sources are operated with different operating parameters, such as microwave powers or gas flows or gas mixtures, etc. The transport of charge carriers from the corresponding microwave plasmas to the substrate surfaces then differs and can be influenced or balanced with the aid of the different voltages. In the case of pulsed microwave powers, the level of the microwave power and the phase position between the individual microwave plasma sources can be synchronised and adapted to the voltage sources at the corresponding plasma electrodes.

Each microwave plasma source (20a, 20b) also has a magnet arrangement (25), which contains first magnets (251) and second magnets (252). The permanent magnets (252), which are opposite one another directly at the region of the plasma discharge opening (291) of the corresponding microwave plasma source, are provided with an opposite polarity. Closed magnetic field lines (illustrated in FIG. 2 as dashed lines) form between the magnet poles of these permanent magnets (252), whereby a magnetic mirror is produced. It is thus possible, for example, to suppress the extraction of electrons compared to the extraction of ions from the plasma space. Here, different magnets (251, 252) of a magnet arrangement (25) of one microwave plasma source (20a or 20b) or of both microwave plasma sources (20a and 20b) can advantageously influence the plasma formation and/or the charge carrier extraction. Mutually opposed magnets (251, 252) of the two microwave plasma sources, for example the first magnets (251) denoted in FIG. 2 by the reference signs A and B, can thus be formed with identical polarity or opposite polarity.

Figure 3:
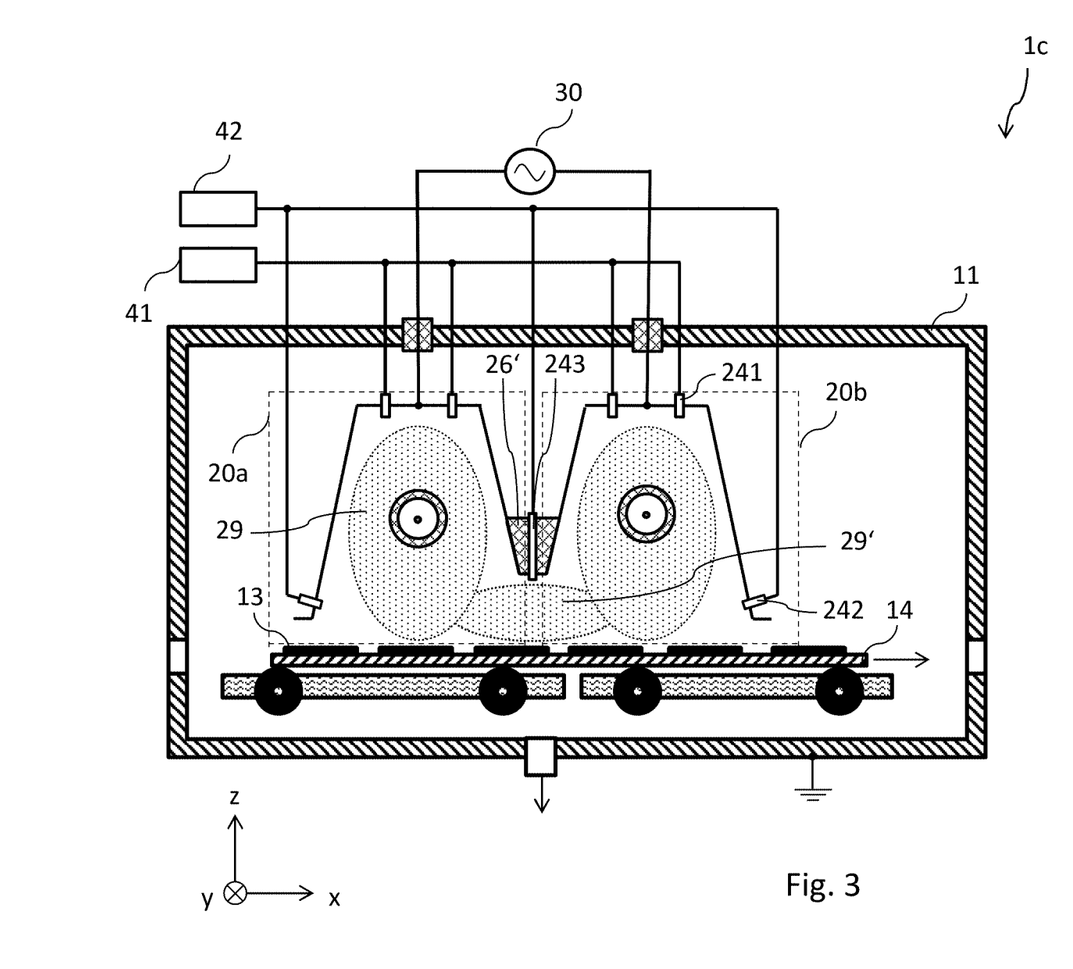
FIG. 3 shows a third embodiment (1c) of the plasma treatment device according to the invention, in which the sides, facing one another, of the plasma source walls (21) of the microwave plasma sources (20a, 20b) is set back in relation to the surface of the substrates (13) to be processed.

FIG. 3 shows a third embodiment (1c) of the plasma treatment device according to the invention, wherein in both microwave plasma sources (20a, 20b) the plasma source wall (21) is used as a plasma electrode (28). In the third embodiment (1c) the first and the second microwave plasma source (20a, 20b) are positioned very closely to one another along the x-direction. The distance is dimensioned on the basis of the physical conditions in order to avoid plasma ignition between the plasma source walls and depends on the level of the voltage potentials, the process pressure, and the used process gases. Furthermore, the sides of the plasma source wall (21) facing one another are electrically insulated from one another by an insulation (26') and are set back in relation to the surface to be treated of the substrates (13). In other words, the plasma source wall (21) of the first microwave plasma source (20a) ends on the side facing the second microwave plasma source (20b) at a position above the substrates (13) with a greater distance along the z-direction from the surface of the substrates (13) than on the side facing away from the second microwave plasma source (20b). The same is true accordingly for the second microwave plasma source (20b). In addition, a common central gas inlet (243) is arranged between the two sides, facing one another, of the plasma source wall (21) of the two microwave plasma sources (20a, 20b), which central gas inlet is connected jointly with the lateral gas inlets (242) of the first and the second microwave plasma sources (20a, 20b) to a common gas supply (41). The upper gas inlets (241) of the two microwave plasma sources (20a, 20b) are also connected to a common, but different gas supply (40). Due to the very short distance between the two microwave plasma sources (20a, 20b) along the x-direction, the set-back plasma source walls (21) on the sides facing one another and the gas inlet (243) positioned there, a plasma is formed in a connection region (29') during the operation of the microwave plasma sources (20a, 20b), which connection region connects the two actual plasma spaces (29) of the microwave plasma sources (20a, 20b) to one another. The electrical connection between the plasmas of the two microwave plasma sources (20a, 20b) can thus also be provided for substrate carriers (14) that are not electrically conductive or that are poorly electrically conductive. Also for the case that successive substrate carriers (14) that are good electrical conductors are not electrically conductively connected to one another, a continuous treatment of the substrates (13) in a continuous feed system can thus be ensured.

Furthermore, the microwave plasma sources (20a, 20b) of the third embodiment (1c) do not have any magnets, these also being merely optional in each of the other embodiments.

Both the type of gas supply and the type of voltage source and the structural embodiment of the individual microwave plasma sources, for example whether with or without plasma screen or magnets, can be freely selected, so that the components of the exemplary embodiments illustrated in FIGS. 1 to 3 can be combined with one another, provided they are not mutually exclusive. Further magnet arrangements (not illustrated) for shaping and influencing the formation of a plasma by the individual microwave plasma sources are also known to a person skilled in the art and constitute options for the design of the microwave plasma sources.

Figure 4:
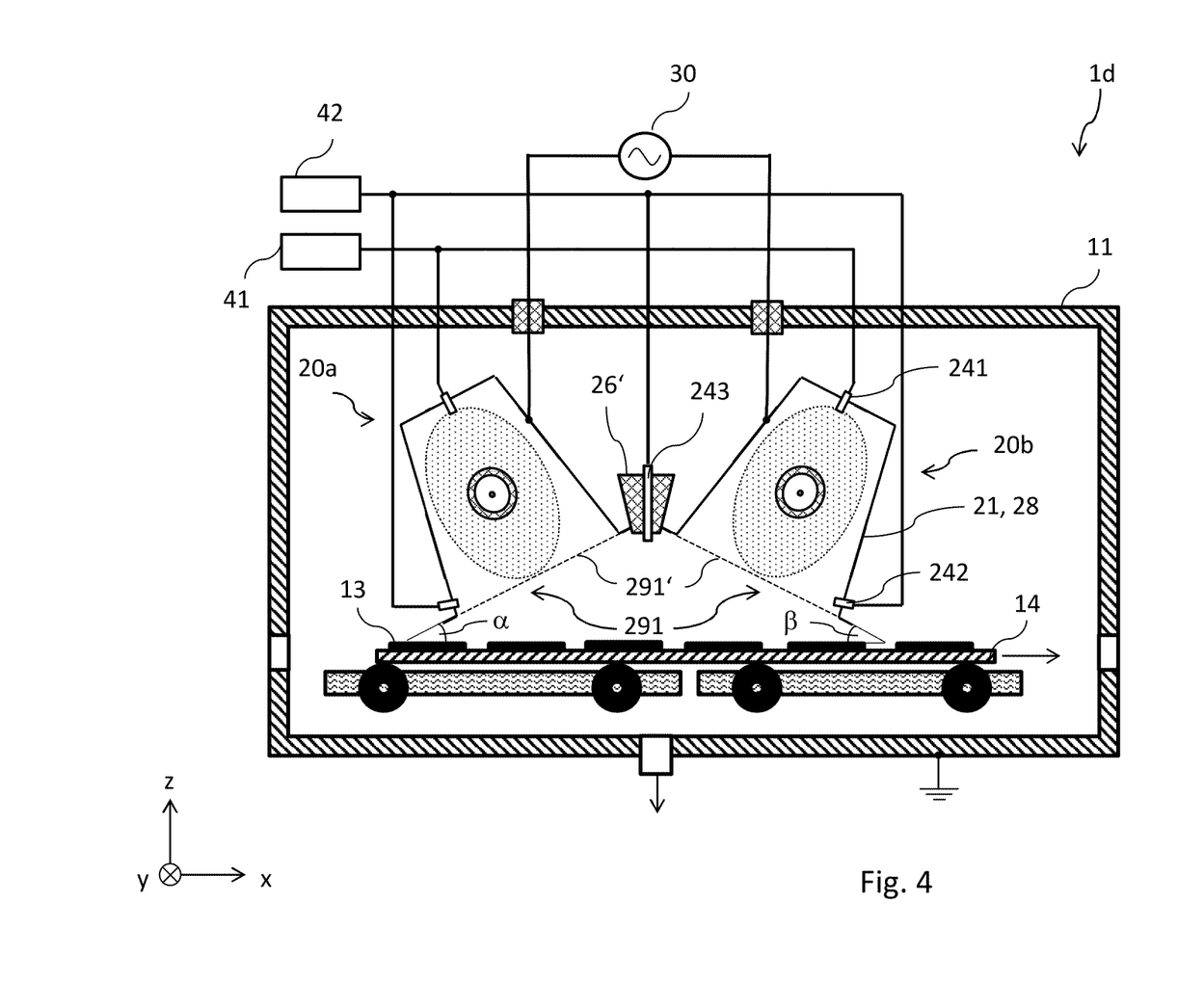
FIG. 4 shows a fourth embodiment (1d) of the plasma treatment device according to the invention, in which the microwave plasma sources (20a, 20b) are inclined relative to the surface of the substrates (13) to be processed.

FIG. 4 shows a fourth embodiment (1d) of the plasma treatment device according to the invention, in which the microwave plasma sources (20a, 20b) are arranged at an incline relative to the surface of the substrates (13) to be processed. Here, a first angle between the plane (291') of the plasma discharge opening (291) of the first microwave plasma source (20a) and the substrate surface to be processed is denoted by α, whereas a second angle between the plane (291') of the plasma discharge opening (291) of the second microwave plasma source (20b) and the substrate surface to be processed is denoted by β. Both angles α and β are of the same size in the illustrated exemplary embodiment and are approximately 30°. An enlarged distance from the substrate plane, i.e. along the z-direction, than in the outwardly directed regions is thus produced for the sides facing one another of the plasma source walls (21). The sides facing one another of the plasma source walls (21) are electrically insulated from one another by an insulation (26'), as already explained with reference to FIG. 3. A region is produced between the plasma discharge openings (291) of the microwave plasma sources (20a, 20b) and the substrates (13) arranged on the substrate carrier (14), in which region the microwave plasmas of the two microwave plasma sources (20a, 20b), or at least the particle flows emanating therefrom, overlap. In the illustrated case, both microwave plasma sources (20a, 20b) are arranged inclined in a similar way relative to the surface of the substrates (13) to be processed. However, the first and the second microwave plasma source (20a, 20b) can also have different angles of inclination, wherein the angles α and β each assume a value greater than 0 (zero) and less than or equal to 90°. Here, the microwave plasma sources are always arranged at an incline relative to one another, so that the two plasma discharge openings (291) are always arranged facing one another at least to a small extent.

Figure 5:
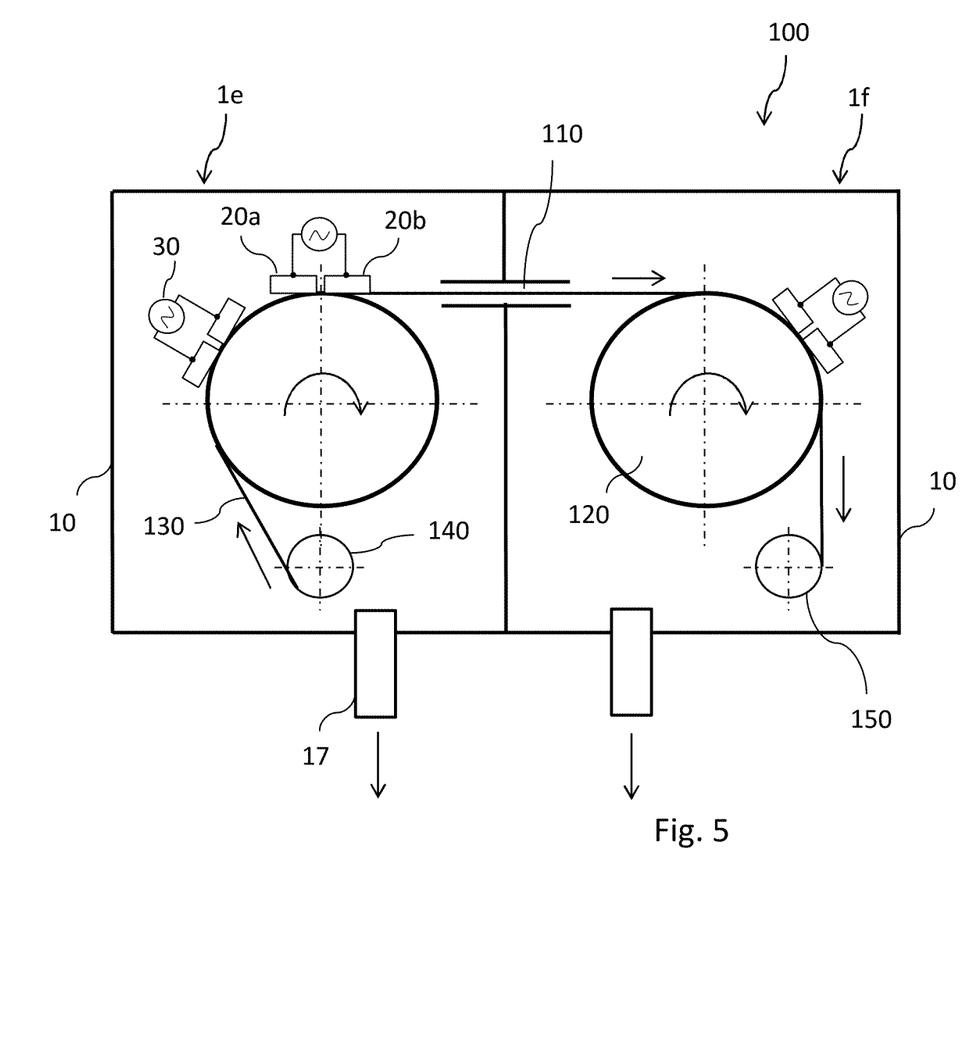
FIG. 5 shows a schematic illustration of an embodiment of a process cylinder system (100) which contains two plasma treatment devices (1d, 1e) according to the invention.

FIG. 5 shows schematically an embodiment of a process cylinder system (100) which contains two plasma treatment devices (1e, 1f) according to the invention and explained by way of example with reference to FIGS. 1 to 4. For reasons of clarity of the illustration, structurally identical components in both plasma treatment devices (1e, 1f) are provided with a reference sign in relation to just one of the plasma treatment devices (1e or 1f), wherein the gas supply systems are not illustrated and the voltage sources are only illustrated schematically and are not illustrated in their actual physical position within the plasma treatment device (1e, 1f). Both plasma treatment devices (1e, 1f) have a treatment chamber (10), which treatment chambers are connected to one another via a port (110) and each have a pump connection point (17). A process cylinder (120), via which a flexible substrate or a flexible substrate carrier (130) is guided by the rotation of the process cylinder (120), is disposed in each plasma treatment device (1e, 1f). The flexible substrate or the flexible substrate carrier (130) can be a film or a foil, for example, which is subjected to a treatment in the plasma treatment devices (1d, 1e), and in doing so is fed from a first stock roll (140) to the processes in the first plasma treatment device (1e), and is wound again onto a second stock roll (150) after the processes in the second plasma treatment device (1f).

Two pairs of microwave plasma sources (20a, 20b), as have been described with reference to FIGS. 1 to 4, are arranged in succession in the first plasma treatment device (1e), wherein each pair of microwave plasma sources (20a, 20b) is supplied with a voltage by means of a specific voltage source (30). The two pairs of microwave plasma sources (20a, 20b), however, can also be supplied with voltage by a common voltage source (30), wherein one of the microwave plasma sources (20a, 20b) of each pair of microwave plasma sources is electrically conductively connected to an output of the voltage source (30) and the other microwave plasma source (20a, 20b) of each pair of microwave plasma sources is electrically conductively connected to another output of the voltage source (30). Here, the microwave plasma sources (20a or 20b), supplied with the same potential, of the two pairs of microwave plasma sources can be arranged in each case in the same position with regard to the transport direction of the substrate or substrate carrier (130) (illustrated by the arrow along the substrate or substrate carrier) within the corresponding pair of microwave plasma sources or can be arranged in opposite positions. Both pairs of microwave plasma sources (20a, 20b) preferably perform the same treatment of the substrate (130) or of the substrates arranged on the substrate carrier (130).

Only one pair of microwave plasma sources (20a, 20b) is arranged in the second plasma treatment device (1f) in the embodiment illustrated in FIG. 5. However, one, two or more pairs of microwave plasma sources (20a, 20b) can of course be arranged in both plasma treatment devices (1e, 1f).

Another treatment of the substrate (130) or of the substrates arranged on the substrate carrier (130) is preferably performed in the second plasma treatment device (1*f*) compared to the treatment performed in the first plasma treatment device (1*e*).

The process cylinder (120) advantageously must not be supplied in each case with a defined potential, since it is not used as reference electrode for one of the plasmas of the microwave plasma sources (20*a*, 20*b*). This extends the service life of the system and enables cost reductions due to the simpler structural design of the process cylinder.

As already mentioned, the components of the system are illustrated merely schematically. The voltage sources (30) in reality are thus preferably arranged outside the treatment chambers (10). The first and second stock rolls (140, 150) can also be arranged outside the treatment chambers.

LIST OF REFERENCE NUMERALS

1*a*-1*f* plasma treatment device
10 treatment chamber
11 chamber wall
12 opening gap
13 substrate
14 substrate carrier
15 transport device
16 heater
17 pump connection point
18 grounding
19 insulated electrical bushing
20*a* first microwave plasma source
20*b* second microwave plasma source
21 plasma source wall
22 plasma screen
23 microwave coupling-in device
231 inner conductor
232 insulation tube
241 upper gas inlet
242 lateral gas inlet
243 central gas inlet
25 magnet arrangement
251, 252 magnets
26, 26' electrical insulation
27 electrical connection to ground
28 plasma electrode
29 plasma space
29' connection region
291 plasma discharge opening
291' plane of the plasma discharge opening
30, 30*a*, 30*b* voltage source
31 electrical feed line
40-43 gas supply
44 gas feed line
100 process cylinder system
110 port
120 process cylinder
130 flexible substrate or substrate carrier
140, 150 stock roll
A, B mutually opposed magnets of the microwave plasma sources
α, β angle of inclination of the plasma discharge opening relative to the plane of the substrate surface

The invention claimed is:

1. A plasma treatment device with
   a treatment chamber,
   at least one pair of microwave plasma sources consisting of a first microwave plasma source and a second microwave plasma source, wherein the first and the second microwave plasma source each have a plasma source wall and, within this, a microwave coupling-in device and a plasma electrode, the first and the second microwave plasma source are arranged within the treatment chamber on the same side of one or more substrates to be processed and adjacently to one another, and the plasma electrodes of the first microwave plasma source and the second microwave plasma source are electrically insulated from one another, and
   a voltage source, which has a first output and a second output and is suitable for generating a potential difference between the first output and the second output, wherein the first output of the voltage source is electrically conductively connected to the plasma electrode of the first microwave plasma source and the second output of the voltage source is electrically conductively connected to the plasma electrode of the second microwave plasma source of the at least one pair of microwave plasma sources.

2. The plasma treatment device according to claim 1, characterised in that the voltage source is a symmetrical voltage source.

3. The plasma treatment device according to claim 1, characterised in that the at least one voltage source is a direct voltage source, a pulsed direct voltage source, or an alternating voltage source.

4. The plasma treatment device according to claim 1, characterised in that at least one of the first or second microwave plasma source has, within the plasma source wall, a plasma screen insulated with respect to ground, which plasma screen at least partially surrounds a plasma space of the microwave plasma source and is used as the plasma electrode.

5. The plasma treatment device according to claim 1, characterised in that the plasma source wall of at least one of the first or second microwave plasma source is insulated with respect to ground and is used as the plasma electrode.

6. The plasma treatment device according to claim 1, characterised in that the sides, facing one another, of the plasma source wall of the first and second microwave plasma sources have a greater distance from the surface of the one or more substrates to be processed compared to the other sides of the plasma source walls.

7. The plasma treatment device according to claim 1, characterised in that at least one of the first and second microwave plasma sources is arranged at an incline relative to the surface of the substrates to be processed.

8. The plasma treatment device according to claim 1, characterised in that the first and the second microwave plasma source have magnets, wherein the mutually opposed magnets of the first and second microwave plasma source are arranged either with identical polarity or with opposite polarity.

9. The plasma treatment device according to claim 1, characterised in that a gas inlet is arranged between the sides, facing one another, of the plasma source wall of the first and second microwave plasma sources, which gas inlet is suitable for admitting a gas into a connection region between the first and the second microwave plasma source, which connection region is adjacent to the surface of the one or more substrates to be processed.

10. The plasma treatment device according to claim 1, characterised in that the plasma treatment device has a common microwave power splitter for the first and second microwave plasma source.

11. The plasma treatment device according to claim 1, further containing a transport device which is suitable for transporting at least one substrate carrier, on which the one or more substrates to be processed are arranged, through the treatment chamber during operation of the first and second microwave plasma sources.

12. The plasma treatment device according to claim 11, characterised in that the substrate carrier is made of an electrically conductive material.

13. A method for operating a plasma treatment device according to claim 1, said method comprising the following steps:
   igniting a plasma in each of the first and second microwave plasma source, in each case with the aid of a microwave power, and
   supplying the plasma electrodes of the first microwave plasma source and of the second microwave plasma source with different potentials during the maintenance of the plasmas in the microwave plasma sources with the aid of the at least one voltage source, wherein the resultant potentials of the plasmas are used in each case as reference potential for the plasma of the other microwave plasma source.

14. The method according to claim 13, characterised in that the voltage provided by the at least one voltage source and dropping across the plasmas of the first and the second microwave plasma source is a direct voltage, a pulsed direct voltage, or an alternating voltage.

15. The method according to claim 13, characterised in that the one or more substrates to be processed are transported through the plasma treatment device during the operation of the first and second microwave plasma sources.

16. The method according to claim 13, characterised in that the microwave coupling-in devices of the first and second microwave plasma source are operated with in-phase or phase-shifted pulsed microwave powers.

17. The method according to claim 16, characterised in that the in-phase or phase-shifted pulsed microwave powers are operated in a manner synchronised with the voltage sources of the first and second microwave plasma source.

* * * * *